(12) United States Patent
Kim

(10) Patent No.: US 7,091,741 B2
(45) Date of Patent: Aug. 15, 2006

(54) INPUT BUFFER CAPABLE OF REDUCING INPUT CAPACITANCE SEEN BY INPUT SIGNAL

(75) Inventor: Kyu-hyoun Kim, Suwon-si (KR)

(73) Assignee: Samsung Electronics, Co., Ltd (KR)

( * ) Notice: Subject to any disclaimer, the term of this patent is extended or adjusted under 35 U.S.C. 154(b) by 115 days.

(21) Appl. No.: 10/949,165

(22) Filed: Sep. 24, 2004

(65) Prior Publication Data

US 2005/0068067 A1 Mar. 31, 2005

(30) Foreign Application Priority Data

Sep. 25, 2003 (KR) ............ 10-2003-0066503

(51) Int. Cl.
*H03K 17/16* (2006.01)
*H03K 19/003* (2006.01)
*H03K 19/094* (2006.01)
*H03K 19/0175* (2006.01)

(52) U.S. Cl. .................. 326/24; 326/21; 326/22; 326/23; 326/26; 326/27; 326/83; 326/86

(58) Field of Classification Search ............ 326/21–24, 326/26–27, 83, 86
See application file for complete search history.

(56) References Cited

U.S. PATENT DOCUMENTS 5,166,956 A * 11/1992 Baltus et al. .............. 375/286
6,573,760 B1 * 6/2003 Gabara ..................... 327/65
6,831,507 B1 * 12/2004 Granville .................. 330/9

* cited by examiner

*Primary Examiner*—Rexford Barnie
*Assistant Examiner*—Jason Crawford
(74) *Attorney, Agent, or Firm*—Mills & Onello LLP

(57) ABSTRACT

Provided is an input buffer whose input capacitance presented to input signals can be reduced. The input buffer includes a first differential amplifier which compares the sizes of a first input signal and a second input signal and outputs an output signal as the result of the comparison; a second differential amplifier which compares the sizes of the first input signal and a reference voltage and outputs a second output signal as the result of the comparison; and a third differential amplifier which compares the sizes of the second input signal and the reference voltage and outputs a third output signal as the result of the comparison, wherein the first differential amplifier shares transistors, to which the first and second input signals are input, with the second and third differential amplifiers. The first differential amplifier operates only in a differential operation mode, and the second and third differential amplifiers operate only in a single operation mode. The phase of the first input signal is opposite to the phase of the second input signal, and the first and second input signals are different signals in the single operation mode. Accordingly, an input buffer is advantageous in that both a differential signal pair and single-ended signals can be received and output and the input capacitance of the input buffer seen by the input signals can be reduced.

19 Claims, 4 Drawing Sheets

INPUT BUFFER CAPABLE OF REDUCING INPUT CAPACITANCE SEEN BY INPUT SIGNAL

BACKGROUND OF THE INVENTION

This application claims the priority of Korean Patent Application No. 2003-66503, filed on Sep. 25, 2003, in the Korean Intellectual Property Office, the contents of which are incorporated herein in their entirety by reference.

FIELD OF THE INVENTION

The present invention relates to an input buffer, and more particularly, to an input buffer whose input capacitance presented to input signals can be reduced.

DESCRIPTION OF THE RELATED ART

Signals input to an input buffer may be categorized into differential signal pairs and single-ended signals. Differential signal pairs consist of pairs of opposite-phase signals that are input to the input buffer, and the single-ended signals are separate signals input to the input buffer.

In some cases, it would be very helpful if when two signals are input to an input buffer, the input buffer operates to appropriately receive and output these signals depending on whether the input signals are a differential signal pair or separate single-ended signals.

FIG. 1 is a circuit diagram of an input buffer 100 that operates differently depending on whether two input signals IN and INB are a differential signal pair or single-ended signals. Referring to FIG. 1, the input buffer 100 includes first through third differential amplifiers 110, 120, and 130. If the two input signals are a differential signal pair, only the first differential amplifier 110 operates.

More specifically, the first differential amplifier 110 compares the sizes of the two input signals IN and INB, amplifies the result of comparison, and outputs an output signal VO1. If the two input signals IN and INB are single-ended signals, i.e., signals having unrelated phase and containing different data, the second and third differential amplifiers 120 and 130 operate.

The second and third differential amplifiers 120 and 130 compare the sizes of the two input signals IN and INB, amplify the result of comparison, and output signals VO2 and VO3.

FIG. 2 is a detailed circuit diagram of an input buffer 100 such as that shown in FIG. 1. FIG. 3 illustrates waveforms of a differential signal pair and two single-ended signals. More specifically, FIG. 3 (1) illustrates waveforms of two input signals IN and INB that are a differential signal pair and FIG. 3 (2) illustrates waveforms of two single-ended signals.

Referring to FIG. 3 (1), the differential signal pair consists of two opposite phase signals. Referring to FIG. 3 (2), the single-ended signals are different signals, that is, they have unrelated phases and different data.

In FIG. 2, reference numerals 210, 220, and 230 correspond to the first differential amplifier 110, the second differential amplifier 120, and the third differential amplifier 130, respectively, of FIG. 1.

If the two input signals IN and INB are a differential signal pair, only a first switch SW1 of the first differential amplifier 210 is switched on, and as a result, only the first amplifier 210 operates. That is, the first amplifier 210 compares the sizes of the two input signals IN and INB, amplifies the result of comparison, and outputs an output signal VO1.

If the two input signals IN and INB are different, single-ended signals, that is, if they have unrelated phases and different data, a second switch SW2 of the second amplifier 220 and a third switch SW3 of the third amplifier 230 are switched on.

Next, the second and third differential amplifiers 220 and 230 respectively compare the sizes of the two input signals IN and INB with a reference voltage VREF, amplify the result of comparison, and output output signals VO2 and VO3.

In the input buffer 200, the input signal IN is applied to a first transistor TR1 and a fourth transistor TR4, and the input signal INB is applied to a second transistor TR2 and a fifth transistor TR5.

As a result, the input capacitance of the input buffer 200 doubles regardless of whether the two input signals IN and INB are a differential signal pair or two single-ended signals, thus lowering the performance of the input buffer 200 at high speeds.

SUMMARY OF THE INVENTION

The present invention provides an input buffer that can reduce its input capacitance presented to input signals and, depending on whether the input signals are a differential signal pair or single-ended signals, operate to appropriately receive and output these signals according to their types.

According to one aspect of the present invention, there is provided an input buffer comprising a first differential amplifier which compares the sizes of a first input signal and a second input signal and outputs an output signal as the result of the comparison;

a second differential amplifier which compares the sizes of the first input signal and a reference voltage and outputs a second output signal as the result of the comparison; and a third differential amplifier which compares the sizes of the second input signal and the reference voltage and outputs a third output signal as the result of the comparison, wherein the first differential amplifier shares transistors, to which the first and second input signals are input, with the second and third differential amplifiers.

In one embodiment, the first differential amplifier operates only in a differential operation mode, and the second and third differential amplifiers operate only in a single operation mode.

In one embodiment, the phase of the first input signal is opposite to the phase of the second input signal, and the first and second input signals are different signals in the single operation mode.

The first differential amplifier can include a first transistor having a gate to which the first input signal is applied, a first terminal connected to a first output node, and a second terminal connected to a first node; and a second transistor having a gate to which the second input signal is applied, a first terminal connected to a second output node, and a second terminal connected to a second node. The first and second nodes are connected in response to a first control signal.

The first differential amplifier can further comprise a current source between a fifth node and a ground voltage; a first switch which connects the first and fifth nodes in response to the first control signal; and a second switch which connects the second and fifth nodes in response to the first control signal.

The second differential amplifier can comprise the first transistor and a third transistor having: a gate to which the reference voltage is applied, a first terminal connected to a third output node, and a second terminal connected to a third node, respectively. The first and third nodes are connected in response to a second control signal.

The second differential amplifier can further comprise a current source between a sixth node and the ground voltage; a third switch which connects the third and sixth nodes in response to the second control signal; and a fourth switch which connects the first and sixth nodes in response to the second control signal.

The third differential amplifier can comprise the second transistor and a fourth transistor having: a gate to which the reference voltage is applied, a first terminal connected to a fourth output node, and a second terminal connected to a fourth node, respectively. The second and fourth nodes are connected in response to the second control signal.

The third differential amplifier can further comprise a current source between a seventh node and the ground voltage; a fifth switch which connects the second and seventh nodes in response to the second control signal; and a sixth switch which connects the fourth and seventh nodes in response to the second control signal.

The first control signal can be generated in the differential operation mode, and the second control signal can be generated in the single operation mode.

According to another aspect of the present invention, there is provided an input buffer comprising a first transistor having a gate to which a first input signal is applied, and a first terminal and a second terminal connected to a first output node and a first node, respectively; a second transistor having a gate to which a second input signal is applied, and a first terminal and a second terminal connected to a second output node and a second node, respectively; a third transistor having a gate to which a reference voltage is applied, and a first terminal and a second terminal connected to a third output node and a third node, respectively; and a fourth transistor having a gate to which the reference voltage is applied, and a first terminal and a second terminal connected to a fourth output node and a fourth node, respectively. The first and second transistors form a first differential amplifier in response to a first control signal, the first and third transistors form a second differential amplifier in response to a second control signal, and the second and fourth transistors form a third differential amplifier in response to the second control signal.

In one embodiment, the first and second nodes are connected in response to the first control signal, the first and third nodes are connected in response to the second control signal, and the second and fourth nodes are connected in response to the second control signal.

In one embodiment, the first differential amplifier operates only in a differential operation mode, and the second and third differential amplifiers operate only in a single operation mode.

In one embodiment, the phase of the first input signal is opposite to the phase of the second input signal.

In one embodiment, the differential operation mode is a mode where the sizes of the first and second input signals are compared with each other and the result of comparison is amplified and output, and the single operation mode is a mode where the sizes of the first input signal and the reference voltage are compared with each other and the result of comparison is amplified and output as an output signal, and the sizes of the second input signal and the reference voltage are compared with one another and the result of the comparison is amplified and output.

The first differential amplifier can further comprise: a first current source between the first node and a ground voltage; a second current source between the second node and the ground voltage; and a first switch which connects the first and second nodes in response to the first control signal.

In one embodiment, the second differential amplifier further comprises: the first current source; a third current source between the third node and the ground voltage; and a second switch which connects the first and third nodes in response to the second control signal.

In one embodiment, the third differential amplifier further comprises: the second current source; a fourth current source between the fourth node and the ground voltage; and a third switch which connects the second and fourth nodes in response to the second control signal.

In one embodiment, the first control signal is generated in the differential operation mode, and the second control signal is generated in the single operation mode.

BRIEF DESCRIPTION OF THE DRAWINGS

The foregoing and other objects, features and advantages of the invention will be apparent from the more particular description of a preferred embodiment of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

Figure 4:
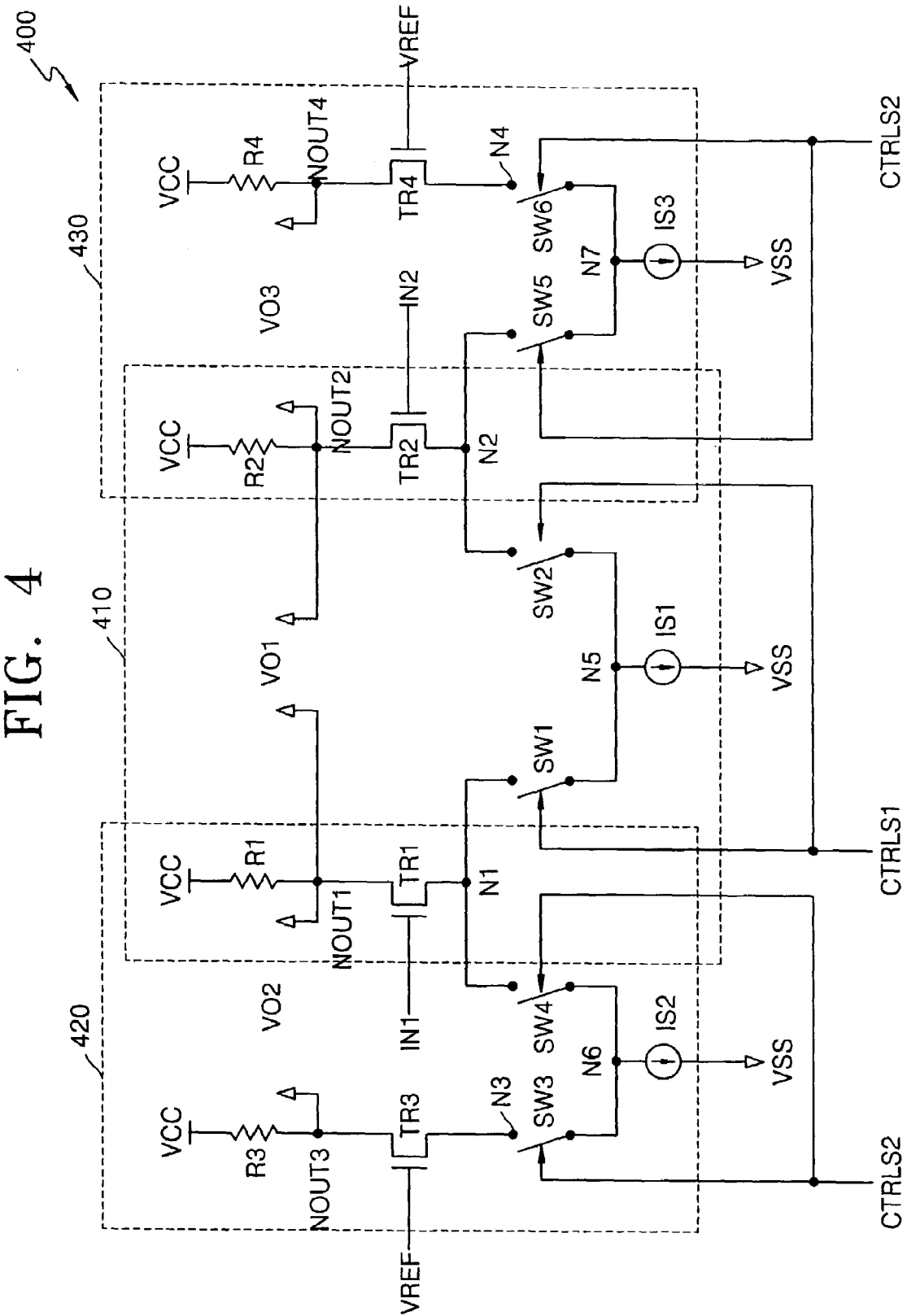
FIG. 4 is a circuit diagram of an input buffer according to an embodiment of the present invention.

FIG. 4 is a circuit diagram of an input buffer 400 according to an embodiment of the present invention. Referring to FIG. 4, the input buffer 400 includes a first differential amplifier 410, a second differential amplifier 420, and a third differential amplifier 430.

The first differential amplifier 410 compares the sizes of first and second input signals IN1 and IN2 and outputs a first output signal VO1 as the result of comparison. The first differential amplifier 410 includes a first transistor TR1 and a second transistor TR2.

The first input signal IN1 is applied to the gate of the first transistor TR1. A first terminal and a second terminal of the first transistor TR1 are connected to a first output node NOUT1 and a first node N1, respectively. The second input signal IN2 is applied to the gate of the second transistor TR2. A first terminal and a second terminal of the second transistor TR2 are connected to a second output node NOUT2 and a second node N2, respectively.

The first and second nodes N1 and N2 are connected to each other in response to a first control signal CTRLS1. The first differential amplifier 410 further includes a current source IS1 between a fifth node N5 and the ground voltage VSS, a first switch SW1 that connects the first and fifth nodes N1 and N5 in response to the first control signal CTRLS1, and a second switch SW2 that connects the second and fifth nodes N2 and N5 in response to the first control signal CTRLS1.

In the input buffer 400, the first differential amplifier 410 shares the first and second transistors TR1 and TR2, to which the first and second input signals IN1 and IN2 are input, respectively, with the second and third differential amplifiers 420 and 430, respectively.

That is, the second differential amplifier 420 shares the first transistor TR1 with the first differential amplifier 410 and further includes a third transistor TR3.

A reference voltage VREF is applied to the gate of the third transistor TR3. A first terminal and a second terminal of the third transistor TR3 are connected to a third output node NOUT3 and a third node N3, respectively. The first and third nodes N1 and N3 are connected to each other in response to a second control signal CTRLS2.

The second differential amplifier 420 further includes a current source IS2 between a sixth node N6 and the ground voltage VSS, a third switch SW3 that connects the third and sixth nodes N3 and N6 in response to the second control signal CTRLS2, and a fourth switch SW4 that connects the first and sixth nodes N1 and N6 in response to the second control signal CTRLS2.

The third differential amplifier 430 shares the second transistor TR2 with the first differential amplifier 410 and further includes a fourth transistor TR4. The reference voltage VREF is applied to the gate of the fourth transistor TR4. A first terminal and a second terminal of the fourth transistor TR4 are connected to a fourth output node NOUT4 and a fourth node N4, respectively. The second and fourth nodes N2 and N4 are connected to each other in response to the second control signal CTRLS2.

The third differential amplifier 430 further includes a current source IS3 between a seventh node N7 and the ground voltage VSS, a fifth switch SW5 that connects the second and seventh nodes N2 and N7 in response to the second control signal CTRLS2, and a sixth switch SW6 that connects the fourth and seventh nodes N4 and N7 in response to the second control signal CTRLS2.

In a differential operation mode, the phase of the first input signal IN1 is opposite to that of the second input signal IN2. In the differential operation mode, only the first differential amplifier 410 operates. To achieve this, only the first and second switches SW1 and SW2 are connected in response to the first control signal CTRLS1.

Then, both the first and second nodes N1 and N2 are connected to the fifth node N5, and the first and second transistors TR1 and TR2 are used only by the first differential amplifier 410. The first differential amplifier 410 compares the sizes of the first and second input signals IN1 and IN2, amplifies the result of comparison, and outputs a first output signal VO1.

In single-ended (or "single") operation mode, the first and second input signals IN1 and IN2 are, in general, different signals, i.e., their phase and data values are, in general, different from each other.

In the single operation mode, only the second and third differential amplifiers 420 and 430 operate. That is, the third and fourth switches SW3 and SW4, and the fifth and sixth switches SW5 and SW6 are closed, in response to the second control signal CTRLS2.

The second differential amplifier 420 includes the first and third transistors TR1 and TR3, and the third differential amplifier 430 includes the second and fourth transistors TR2 and TR4.

The second differential amplifier 420 compares the sizes of the first input signal IN1 and the reference voltage VREF, amplifies the result of comparison, and outputs a second output signal VO2. The third differential amplifier 430 compares the sizes of the second input signal IN2 and the reference voltage VREF, amplifies the result of comparison, and outputs a third output signal VO3.

Accordingly, the input buffer 400 generates the first output signal VO1 using only the first differential amplifier 410 when the input signals IN1 and IN2 are a differential signal pair, and generates the second and third output signals VO2 and VO3 using the second and third differential amplifiers 420 and 430 when the input signals IN1 and IN2 are single-ended signals.

That is, the input buffer 400 can operate in differential operation mode or single operation mode, depending on the types of input signals IN1 and IN2.

Figure 1:
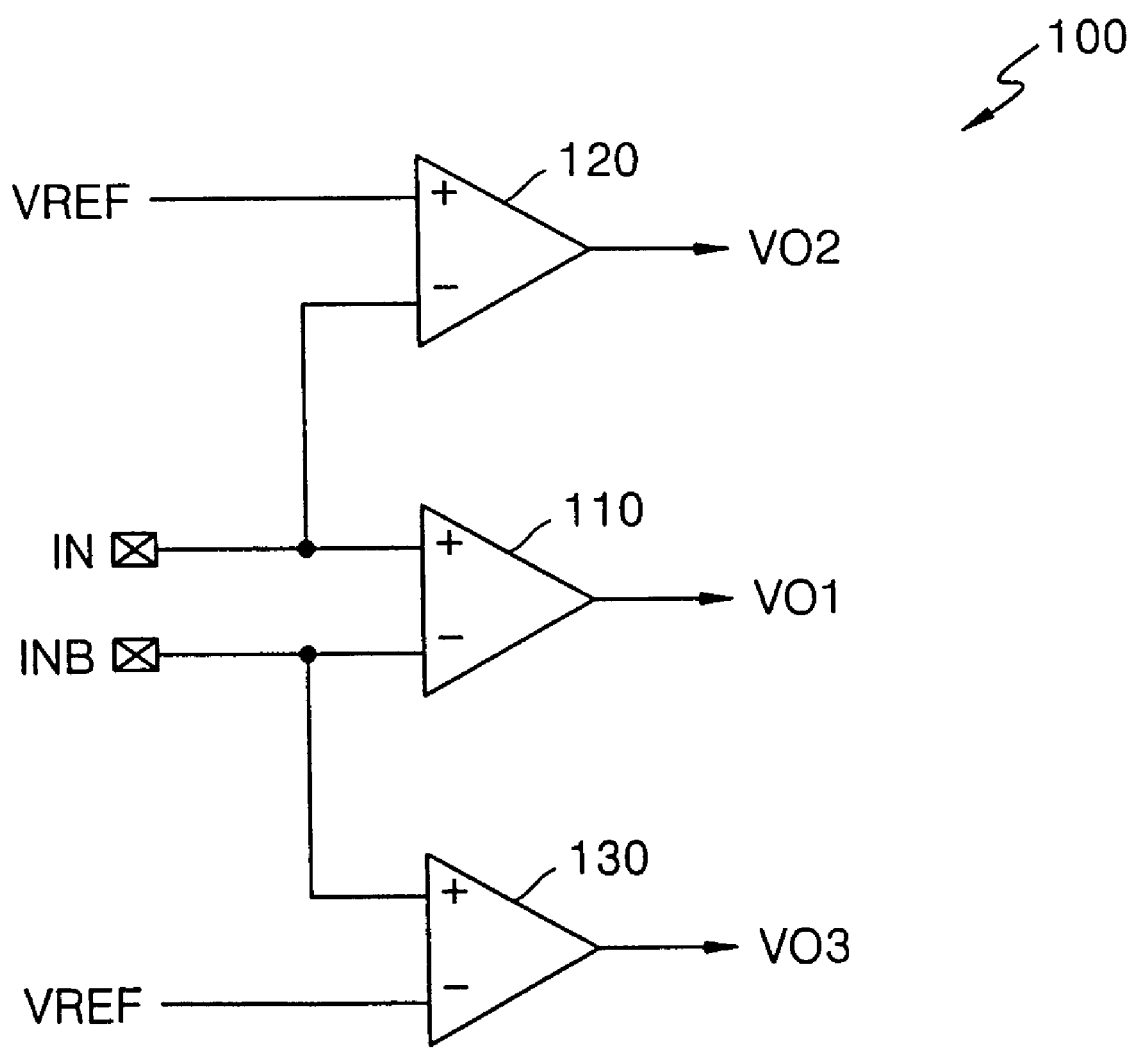
FIG. 1 is a circuit diagram of a conventional input buffer that operates differently depending on whether two input signals are a differential signal pair or two single-ended signals.
Figure 2:
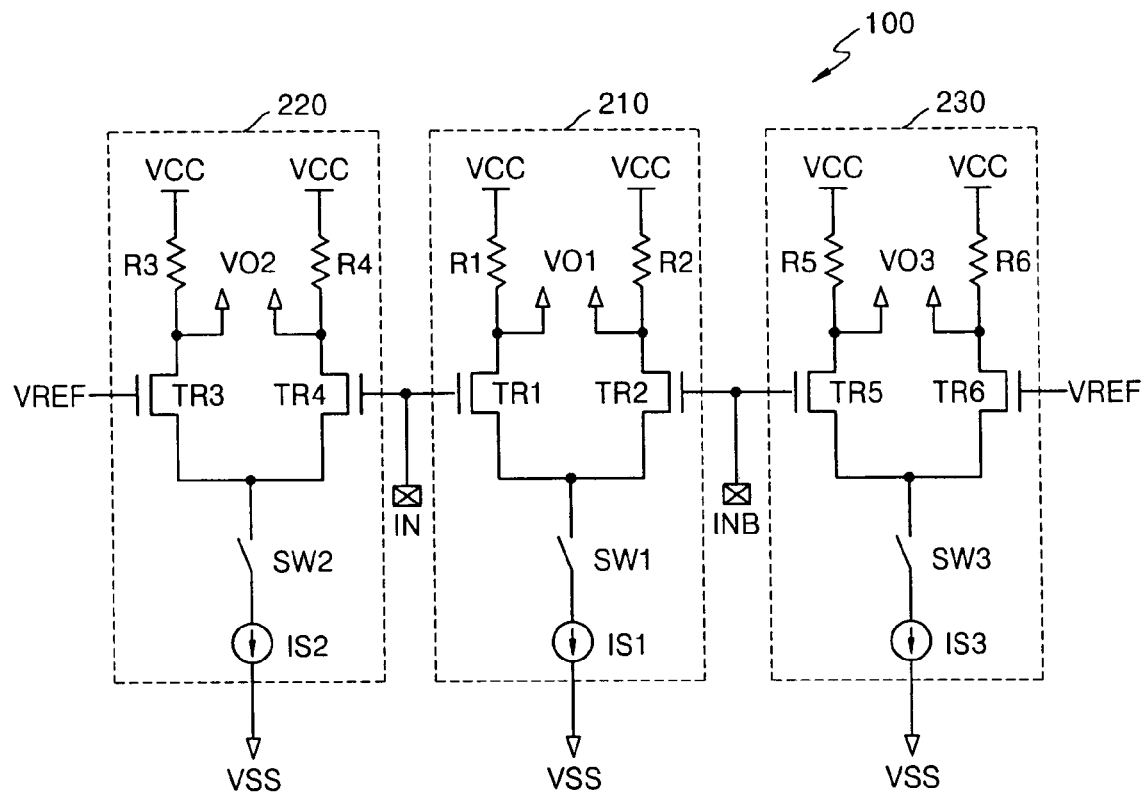
FIG. 2 is a detailed circuit diagram of the conventional input buffer of FIG. 1.
Figure 3:
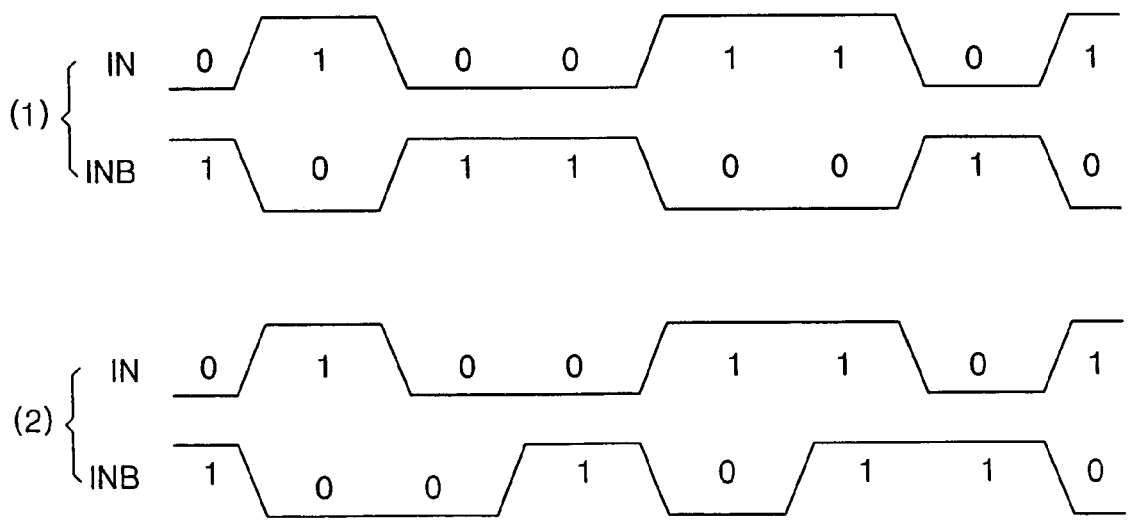
FIG. 3 schematically illustrates waveforms of a differential signal pair and two single-ended signals.

Unlike the conventional input buffer 200 of FIG. 2, the input buffer 400 receives the first input signal IN1 using only the first transistor TR1 and receives the second input signal IN2 using only the second transistor TR2. Accordingly, it is possible to lessen the input capacitance of the input buffer 400 as seen by the input signals IN1 and IN2.

In the input buffer 400, the first transistor TR1 is shared by the first and second differential amplifiers 410 and 420 and the second transistor TR2 is shared by the first and third differential amplifiers 410 and 430. Accordingly, the input capacitance of the input buffer 400 as seen by the first and second input signals IN1 and IN2 is less than that of the conventional input buffer 200.

Figure 5:
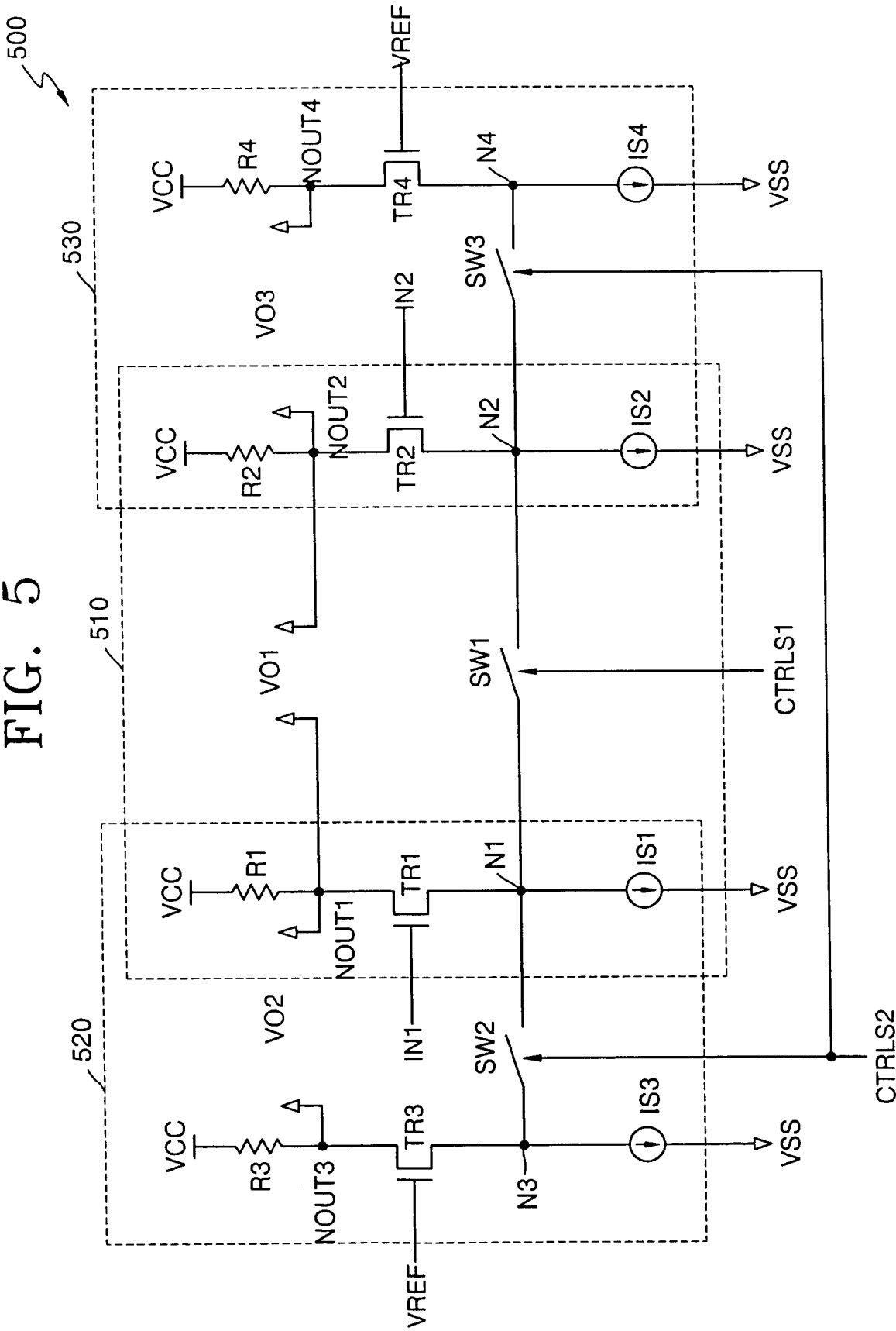
FIG. 5 is a circuit diagram of an input buffer according to another embodiment of the present invention.

FIG. 5 is a circuit diagram of an input buffer 500 according to another embodiment of the present invention. Referring to FIG. 5, the input buffer 500 includes first through fourth transistors TR1 through TR4.

A first input signal IN1 is input to the gate of the first transistor TR1. A first terminal and a second terminal of the first transistor TR1 are connected to a first output node NOUT1 and a first node N1, respectively. A second input signal IN2 is input to a gate of the second transistor TR2. A first terminal and a second terminal of the second transistor TR2 are connected to a second output node NOUT2 and a second node N2, respectively.

A reference voltage VREF is applied to the gate of the third transistor TR3. A first terminal and a second terminal of the third transistor TR3 are connected to a third output node NOUT3 and a third node N3, respectively. The reference voltage VREF is also applied to a gate of the fourth transistor TR4. A first terminal and a second terminal of the fourth transistor TR4 are connected to a fourth output node NOUT4 and a fourth node N4, respectively.

In response to a first control signal CTRLS1, the first and second transistors TR1 and TR2 form the first differential amplifier 510. In response to a second control signal CTRLS2, the first and third transistors TR1 and TR3 form the second differential amplifier 520. Also, in response to the second control signal CTRLS2, the second and fourth transistors TR2 and TR4 form the third differential amplifier 530.

The first and second nodes N1 and N2 are connected in response to the first control signal CTRLS1, and the first and third nodes N1 and N3 are connected and the second and fourth nodes N2 and N4 are connected in response to the second control signal CTRLS2.

The input buffer 500 requires only a first switch SW1 to connect the first and second nodes N1 and N2, whereas the input buffer 400 requires both the first and second switches SW1 and SW2 to connect the first and second nodes N1 and N2. Accordingly, a reduction in voltage caused by the use of switches is less in the first differential amplifier 510 than in the first differential amplifier 410 of FIG. 4.

Similarly, the input buffer 400 of FIG. 4 requires both the switches SW3 and SW4 to connect the first and third nodes N1 and N3, but the input buffer 500 of FIG. 5 requires only a second switch SW2 to connect the first and third nodes N1 and N3. Therefore, a reduction in voltage caused by the use of switches is less in the second differential amplifier 520 of FIG. 5 than in the second differential amplifier 420 of FIG. 4.

Also, the input buffer 400 of FIG. 4 uses both the fifth and sixth switches SW5 and SW6 to connect the second and fourth nodes N2 and N4, but the input buffer 500 of FIG. 5 uses only a third switch SW3 to connect the second and fourth nodes N2 and N4. Therefore, a reduction in voltage caused by use of switches is less in the third differential amplifier 530 than in the third differential amplifier 430 of FIG. 4.

The configuration of the input buffer 500 is the same as that of the input buffer 400, except for the configuration of the switches. Therefore, a detailed description of the constitution of the input buffer 500 will not be repeated here.

As described above, an input buffer according to the present invention is advantageous in that both a differential signal pair and single-ended signals can be received and output and the input capacitance of the input buffer seen by the input signals can be reduced.

While this invention has been particularly shown and described with reference to embodiments thereof, it will be understood by those skilled in the art that various changes in form and details may be made therein without departing from the spirit and scope of the invention as defined by the appended claims.

What is claimed is:

1. An input buffer comprising:
   a first differential amplifier which compares the sizes of a first input signal and a second input signal and outputs an output signal as the result of the comparison;
   a second differential amplifier which compares the sizes of the first input signal and a reference voltage and outputs a second output signal as the result of the comparison; and
   a third differential amplifier which compares the sizes of the second input signal and the reference voltage and outputs a third output signal as the result of the comparison,
   wherein the first differential amplifier shares transistors, to which the first and second input signals are input, with the second and third differential amplifiers.

2. The input buffer of claim 1, wherein the first differential amplifier operates only in a differential operation mode, and the second and third differential amplifiers operate only in a single operation mode.

3. The input buffer of claim 2, wherein the phase of the first input signal is opposite to the phase of the second input signal, and
   the first and second input signals are different signals in the single operation mode.

4. The input buffer of claim 3, wherein the first differential amplifier comprises:
   a first transistor having a gate to which the first input signal is applied, a first terminal connected to a first output node, and a second terminal connected to a first node; and
   a second transistor having a gate to which the second input signal is applied, a first terminal connected to a second output node, and a second terminal connected to a second node,
   wherein the first and second nodes are connected in response to a first control signal.

5. The input buffer of claim 4, wherein the first differential amplifier further comprises:
   a current source between a fifth node and a ground voltage;
   a first switch which connects the first and fifth nodes in response to the first control signal; and
   a second switch which connects the second and fifth nodes in response to the first control signal.

6. The input buffer of claim 4, wherein the second differential amplifier comprises:
   the first transistor; and
   a third transistor having a gate to which the reference voltage is applied, a first terminal connected to a third output node, and a second terminal connected to a third node, respectively,
   wherein the first and third nodes are connected in response to a second control signal.

7. The input buffer of claim 6, wherein the second differential amplifier further comprises:
   a current source between a sixth node and the ground voltage;
   a third switch which connects the third and sixth nodes in response to the second control signal; and
   a fourth switch which connects the first and sixth nodes in response to the second control signal.

8. The input buffer of claim 4, wherein the third differential amplifier comprises:
   the second transistor; and
   a fourth transistor having a gate to which the reference voltage is applied, a first terminal connected to a fourth output node, and, and a second terminal connected to a fourth node, respectively,
   wherein the second and fourth nodes are connected in response to the second control signal.

9. The input buffer of claim 8, wherein the third differential amplifier further comprises:
   a current source between a seventh node and the ground voltage;
   a fifth switch which connects the second and seventh nodes in response to the second control signal; and
   a sixth switch which connects the fourth and seventh nodes in response to the second control signal.

10. The input buffer of claim 9, wherein the first control signal is generated in the differential operation mode, and
    the second control signal is generated in the single operation mode.

11. An input buffer comprising:
    a first transistor having a gate to which a first input signal is applied, and a first terminal and a second terminal connected to a first output node and a first node, respectively;
    a second transistor having a gate to which a second input signal is applied, and a first terminal and a second terminal connected to a second output node and a second node, respectively;

a third transistor having a gate to which a reference voltage is applied, and a first terminal and a second terminal connected to a third output node and a third node, respectively; and a fourth transistor having a gate to which the reference voltage is applied, and a first terminal and a second terminal connected to a fourth output node and a fourth node, respectively, wherein the first and second transistors form a first differential amplifier in response to a first control signal, the first and third transistors form a second differential amplifier in response to a second control signal, and the second and fourth transistors form a third differential amplifier in response to the second control signal.

12. The input buffer of claim 11, wherein the first and second nodes are connected in response to the first control signal, the first and third nodes are connected in response to the second control signal, and the second and fourth nodes are connected in response to the second control signal.

13. The input buffer of claim 11, wherein the first differential amplifier operates only in a differential operation mode, and the second and third differential amplifiers operate only in a single operation mode.

14. The input buffer of claim 13, wherein the phase of the first input signal is opposite to the phase of the second input signal.

15. The input buffer of claim 14, wherein the differential operation mode is a mode where the sizes of the first and second input signals are compared with each other and the result of comparison is amplified and output, and the single operation mode is a mode where the sizes of the first input signal and the reference voltage are compared with each other and the result of comparison is amplified and output as an output signal, and the sizes of the second input signal and the reference voltage are compared with one another and the result of the comparison is amplified and output.

16. The input buffer of claim 11, wherein the first differential amplifier further comprises:

a first current source between the first node and a ground voltage;

a second current source between the second node and the ground voltage; and a first switch which connects the first and second nodes in response to the first control signal.

17. The input buffer of claim 16, wherein the second differential amplifier further comprises:

the first current source;

a third current source between the third node and the ground voltage; and a second switch which connects the first and third nodes in response to the second control signal.

18. The input buffer of claim 16, wherein the third differential amplifier further comprises:

the second current source;

a fourth current source between the fourth node and the ground voltage; and a third switch which connects the second and fourth nodes in response to the second control signal.

19. The input buffer of claim 11, wherein the first control signal is generated in the differential operation mode, and the second control signal is generated in the single operation mode.

* * * * *